(12) United States Patent
Phan et al.

(10) Patent No.: US 7,187,796 B1
(45) Date of Patent: Mar. 6, 2007

(54) SYSTEMS AND METHODS THAT EMPLOY EXPOSURE COMPENSATION TO PROVIDE UNIFORM CD CONTROL ON RETICLE DURING FABRICATION

(75) Inventors: Khoi A. Phan, San Jose, CA (US); Ramkumar Subramanian, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 70 days.

(21) Appl. No.: 10/676,613

(22) Filed: Oct. 1, 2003

(51) Int. Cl.
*G06K 9/00* (2006.01)

(52) U.S. Cl. ...................................... 382/144

(58) Field of Classification Search ...................... None
See application file for complete search history.

(56) References Cited

U.S. PATENT DOCUMENTS

| | | | | |
|---|---|---|---|---|
| 5,787,190 | A * | 7/1998 | Peng et al. .................. | 382/145 |
| 5,801,954 | A * | 9/1998 | Le et al. ........................ | 716/21 |
| 6,331,711 | B1 * | 12/2001 | Vernon ..................... | 250/492.2 |
| 6,448,097 | B1 * | 9/2002 | Singh et al. .................. | 438/16 |
| 6,458,605 | B1 * | 10/2002 | Stirton .......................... | 438/7 |
| 6,492,094 | B1 * | 12/2002 | Bojko .......................... | 430/296 |
| 6,509,201 | B1 * | 1/2003 | Wright ......................... | 438/16 |
| 6,582,861 | B2 * | 6/2003 | Buxbaum et al. .............. | 430/5 |
| 6,583,871 | B1 * | 6/2003 | Rangarajan et al. ..... | 356/237.5 |
| 6,597,463 | B1 * | 7/2003 | Singh et al. ................. | 356/630 |
| 6,721,691 | B2 * | 4/2004 | Bao et al. ................... | 702/189 |
| 6,931,618 | B1 * | 8/2005 | Tabery et al. ................. | 716/19 |
| 2003/0000922 | A1 * | 1/2003 | Subramanian et al. ........ | 216/60 |

* cited by examiner

*Primary Examiner*—Bhavesh M. Mehta
*Assistant Examiner*—Christopher Lavin
(74) *Attorney, Agent, or Firm*—Amin, Turocy, & Calvin, LLP

(57) ABSTRACT

The present invention relates to monitoring and controlling a reticle fabrication process (e.g. employed with an electron beam lithography process). A typical fabrication process involves discrete stages including exposure, post-exposure bake and development. After fabrication is complete, an inspection can be performed on the reticle to determine whether any parameters during fabrication and/or any data points are outside of acceptable tolerances. The data is collected and fed into an algorithm (e.g. data-mining algorithm) utilized to determine which fabrication parameters need to be modified then sends the data to a control system (e.g. advanced process control) to facilitate needed changes to the fabrication parameters.

14 Claims, 16 Drawing Sheets

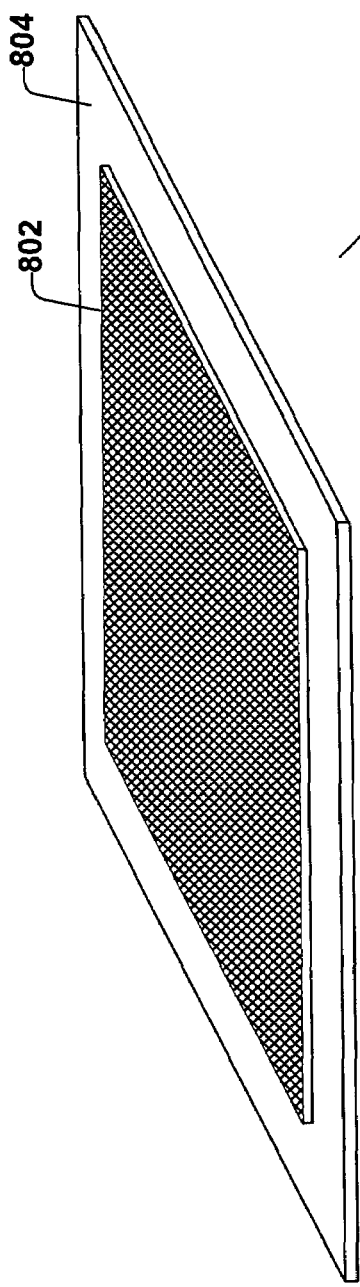
Fig. 8
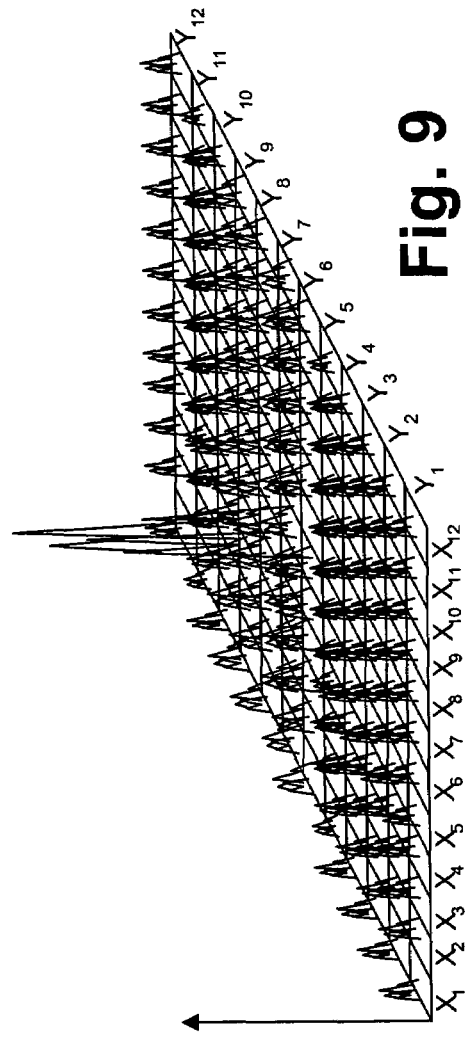
Fig. 10
Fig. 9

SYSTEMS AND METHODS THAT EMPLOY EXPOSURE COMPENSATION TO PROVIDE UNIFORM CD CONTROL ON RETICLE DURING FABRICATION

TECHNICAL FIELD

The present invention generally relates to semiconductor processing, and in particular to improving process control and device performance via mitigating critical dimension (CD) variance utilizing a feedback/feed forward system.

BACKGROUND

In the semiconductor industry, there is a trend to fabricate higher device densities. To achieve higher and higher densities per chip, efforts continue to scale down device dimensions (e.g., at submicron levels) on semiconductor wafers. For example, smaller and smaller feature sizes are being fabricated on integrated circuits (ICs) within small rectangular portions of the wafer, commonly known as dies. Examples of such features include width and spacing of interconnecting lines, spacing and diameter of contact holes and surface geometry such as corners and edges. In order to scale down device dimensions, precision control of the fabrication process is required. The dimension of and between features typically is referred to as critical dimensions or CD. Reducing CDs and reproducing more accurate CDs facilitates achieving higher device densities through scaled down dimensions and increased packing.

The process of manufacturing semiconductors or ICs typically includes numerous steps (e.g., exposing, baking, developing, etc.), during which hundreds of copies of an integrated circuit can be formed on a single wafer, and more particularly on each die of the wafer. In many of these steps, material is overlayed or removed from existing layers at specific locations to form desired elements of the integrated circuit. Generally, the manufacturing process involves creating several patterned layers on and into a substrate that ultimately forms the complete integrated circuit. This layering process creates electrically active regions in and on the semiconductor wafer surface.

In general, lithography refers to a process for pattern transfer between various media. It is a technique utilized in integrated circuit fabrication in which a silicon slice (the wafer) is coated uniformly with a radiation-sensitive film (the photoresist) and an exposing source (such as optical light, X-rays, or an electron beam) illuminates selected areas of the surface through an intervening master template (the photoresist mask) to form a particular pattern. The lithographic coating generally is a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, can be at least one portion of a semiconductor device that contributes to the overall structure and function of the device.

Because the photoresist is used to form features on semiconductor devices, the integrity of the photoresist must be maintained throughout the lithography process. That is, any flaw or structural defect that is present on a patterned photoresist can be indelibly transferred to underlying layers during a subsequent etch process wherein the photoresist is employed.

The causes of mask (reticle) CD errors have two primary sources: the process (resist, develop, etch) and the writing tool. Over the past few years, the mask industry has been focused on migrating to dry-etch processes in order to achieve better CD control during the chrome patterning. However, to achieve better resolution and to improve the CD uniformity of resist images, photomask manufacturing will require the use of higher energy e-beam exposure systems. Each of these improved specifications has required in the past and will require in the future a reevaluation of the resist systems being used, since the performance of the resist will be one of the most important factors in meeting advanced mask-fabrication specifications.

One particular area of concern in the reticle manufacturing process involves the time between exposure and post-expose bake of the reticle. Critical dimensions (CDs) written onto the surface of a reticle can vary since the chemically amplified resists (CARs) utilized with electron beam lithography (reticle fabrication) are very susceptible to airborne contaminants.

There are a number of factors related to the utilization of CARs such as the stability of the resist related to environmental contaminants such as airborne amines, sensitivity to post-apply and post-exposure bake (PAB/PEB) temperature variations and post-coat and post-exposure delay stability. Stability of CDs related to time delay is commonly known as the vacuum effect. The vacuum effect describes when the CD of a feature varies in response to the time spent under high vacuum after exposure.

Therefore, when utilizing CARs to facilitate the exposure of a mask to an electron beam, what is needed is a system to ensure the CDs written on a reticle by an e-beam lithography system are consistent throughout a given fabrication process.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

According to various aspects of the present invention, a data collection component can be employed with a fabrication process, such as the fabrication of a reticle, to collect information (e.g. features, CDs) relating to desired tolerances in the fabrication process. The data collected can be provided by a post-fabrication measurement system such as scatterometry for example. The measurements can be utilized to generate control data that can be fed forward and/or backward to selectively adjust one or more fabrication components and/or operating parameters associated therewith to bring critical dimensions within acceptable tolerances.

According to another aspect of the invention, the data collection component can employ an algorithm (e.g. data-mining algorithm) to facilitate or automatically determine adjusted control parameters of the fabrication process.

According to yet another aspect of the subject invention, an advanced process control (APC) component can be utilized to facilitate feedback and/or feed forward changes to specified control parameters.

To the accomplishment of the foregoing and related ends, certain illustrative aspects of the invention are described herein in connection with the following description and the annexed drawings. These aspects are indicative, however, of but a few of the various ways in which one or more of the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 8 illustrates a perspective view of a grid-mapped wafer according to one or more aspects of the present invention.

FIG. 9 illustrates plots of measurements taken at grid-mapped locations on a wafer in accordance with one or more aspects of the present invention.

FIG. 10 illustrates a table containing entries corresponding to measurements taken at respective at grid-mapped locations on a wafer in accordance with one or more aspects of the present invention.

DETAILED DESCRIPTION

Figure 1:
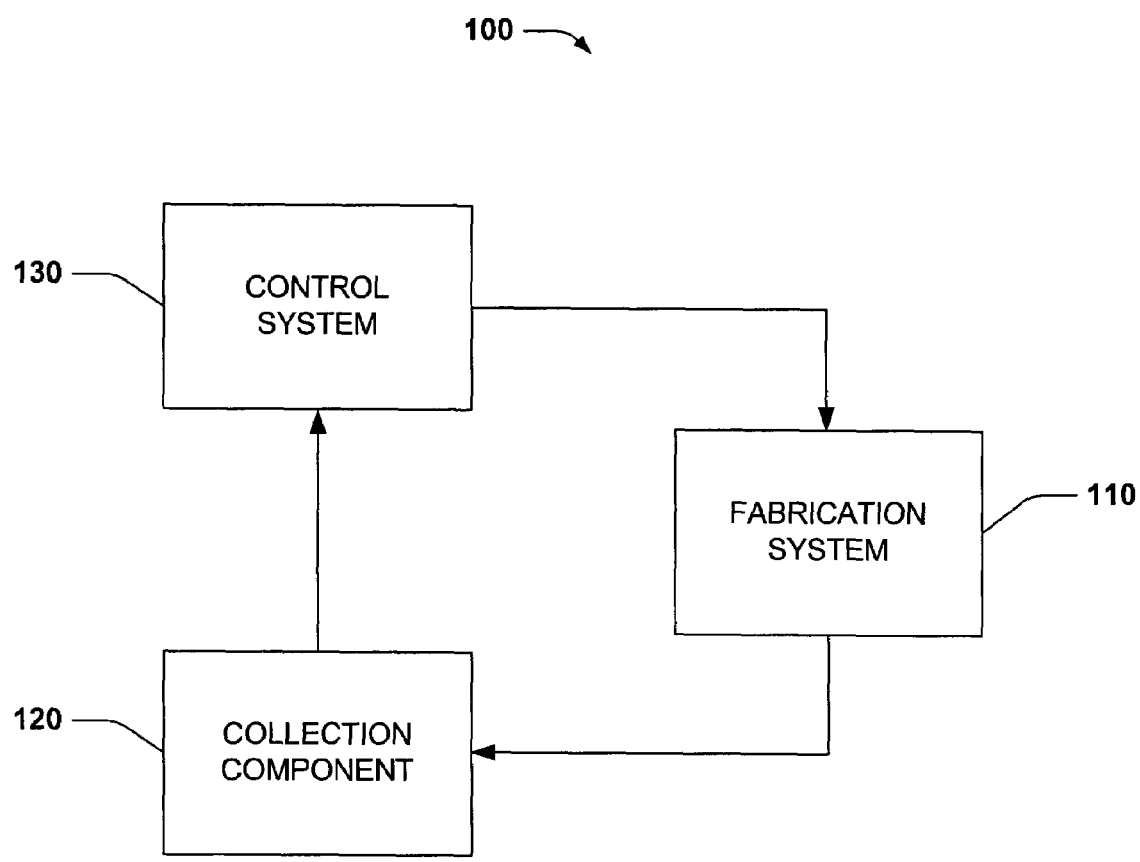
FIG. 1 illustrates a system utilized to provide data collection and process control of a fabrication system.

FIG. 1 illustrates a system that can be utilized in the fabrication of a reticle utilizing electron beam lithography 100 that collects, analyzes and subsequently controls a fabrication system 110 in accordance with an aspect of the present invention. The system 100 comprises a fabrication system 110, a collection component 120 and a control system 130, wherein the output of the fabrication system 110 is conveyed to the collection component 120 and then utilized by the control system 130 to facilitate modification of control parameters utilized in the fabrication system 110.

The fabrication system 110 can be employed to fabricate a reticle which can be employed in the manufacture of semiconductor devices. The fabrication of a reticle can include a plurality of process steps including expose, post-expose bake (PEB) and develop. For example, a reticle can be exposed utilizing electrons, X-rays, ions or other optical lithography methods. A PEB step can be employed to further process the resist utilized in the expose process. If a chemically amplified resist is utilized, this process facilitates a chemical change. Afterward, a develop process can be employed utilizing immersion, puddle or spray methods, for example, to complete the fabrication process.

After a product has been fabricated, the collection component 120 obtains information from the fabrication process which is indicative of the fabrication process. Such data can be pulled by the collection component 120 from the fabrication system 110 or can be fed (e.g. polled) to the collection component 120, and saved in memory and/or a storage device(s). Collected data can be processed via a data-mining algorithm utilized to determine an action(s) such as a modification to the fabrication parameters. It is to be appreciated that various other suitable algorithms can be employed to process the data fed to the control system.

Once the data is collected, the control system 130 facilitates changes to the fabrication system parameters to provide for fabricating products that conform to a desired tolerance(s). The control system can be a feedback and/or feed forward system for example.

Figure 2:
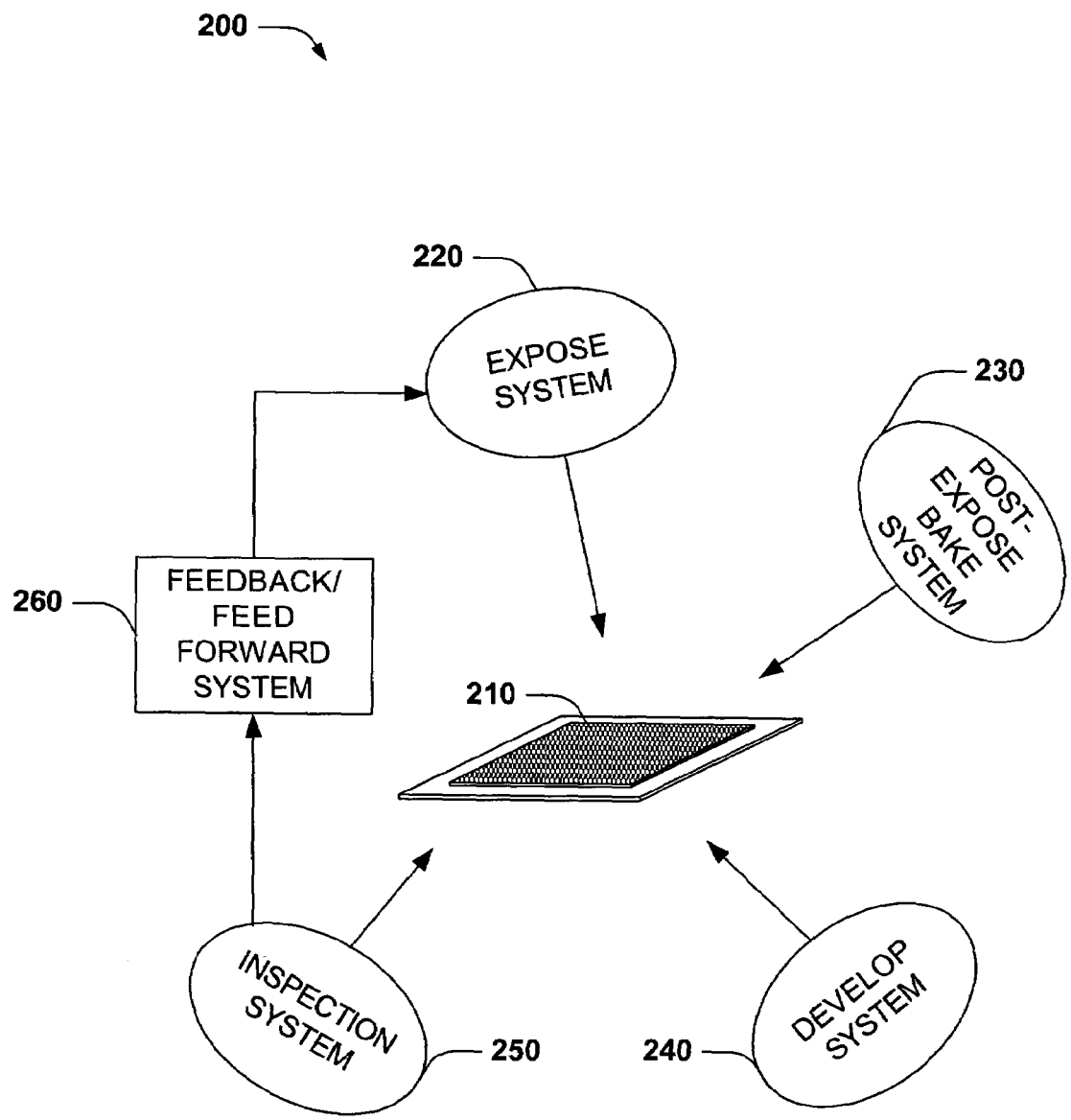
FIG. 2 illustrates an example of a plurality of processes that can be employed in the fabrication of a reticle.

FIG. 2 illustrates a system 200 that can be utilized in the fabrication of a reticle employed in the manufacture of semiconductor devices. For example, the system 200 can be substantially similar to or different from system 100. In this particular embodiment, a process is comprised of three discrete components in the fabrication of a reticle 210. The three components, expose 220, post-expose bake (PEB) 230 and develop 240, can be completed in disparate locations within a factory for example. Also, one or more of the components may not be necessary to fabricate certain types of reticles (e.g. a resist that does not require a PEB stage). After the reticle has been fabricated an inspection process 250 can be implemented to determine if parameters relating to the fabrication of the product meet desired tolerance(s). This information is accepted by a feedback/feed forward system 260 which can be employed to provide changes to one or more of the above-described steps. Feedback control can be utilized to make changes to a reticle in situ before a final product is fabricated. Also, feed forward control can be utilized to change parameters to future fabrications based on information received current fabrications.

Figure 3:
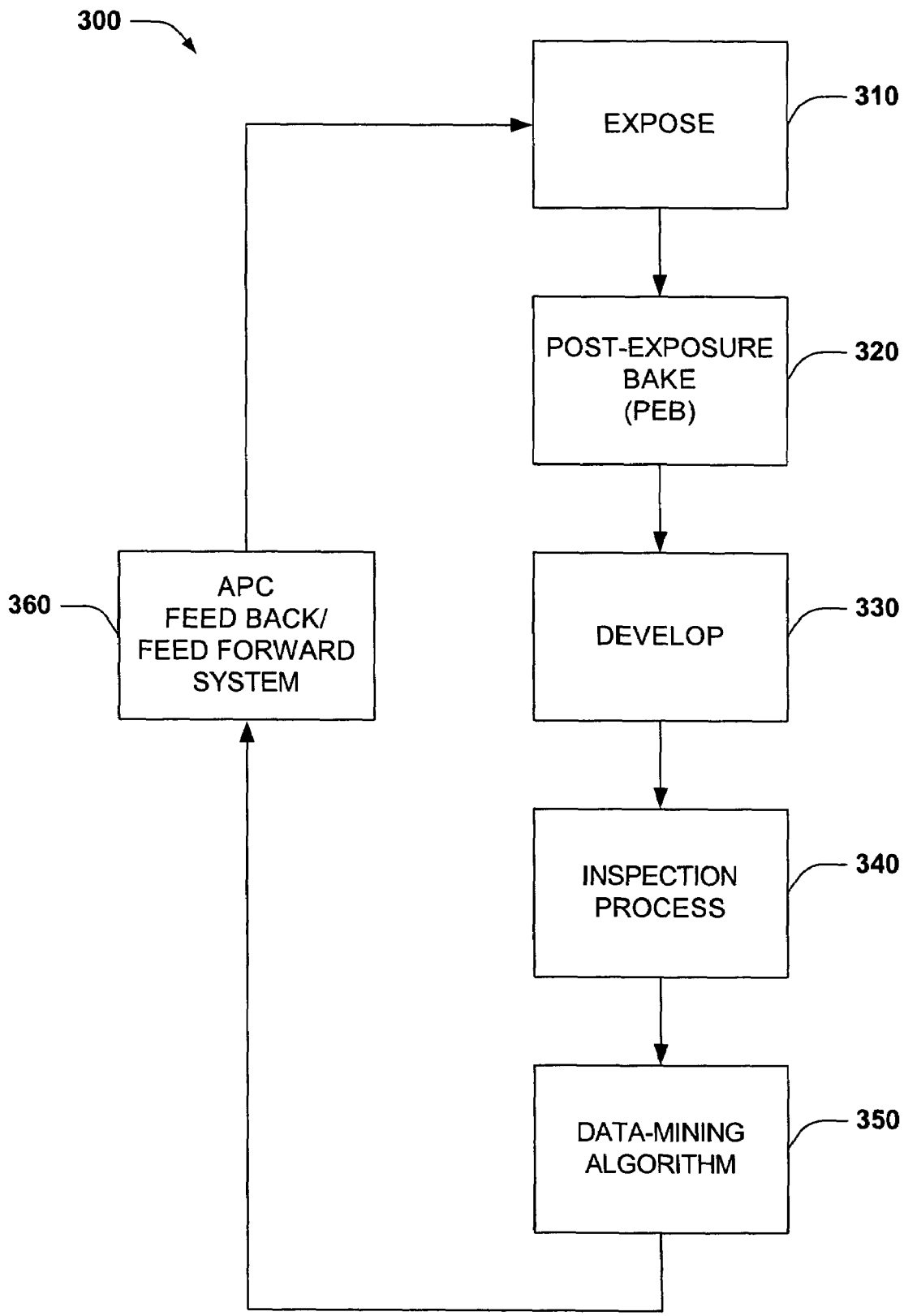
FIG. 3 illustrates a particular embodiment of a reticle fabrication process including a data-mining algorithm and an APC control system.

FIG. 3 illustrates a methodology in accordance with the present invention. For simplicity of explanation, the methodology is depicted and described as a series of acts. It is to be understood and appreciated that the present invention is not limited by the acts illustrated and/or by the order of acts, for example acts can occur in various orders and/or concurrently, and with other acts not presented and described herein. Furthermore, not all illustrated acts may be required to implement a methodology in accordance with the present invention. In addition, those skilled in the art will understand and appreciate that a methodology could alternatively be represented as a series of interrelated states (e.g., state diagram) or events.

FIG. 3 illustrates a methodology 300 for fabricating a binary reticle in accordance with at least one aspect of this invention. The process involves three steps (expose 310, post-expose bake 320 and develop 330) dedicated to the fabrication of the reticle followed by an inspection process 340 (e.g. metrology) and a data-mining algorithm 350 which provides information to an advanced process control (APC) system 360.

At 310, the expose stage, a blank binary reticle comprised of a quartz substrate, a chrome film, and a chemically amplified resist is introduced to an electron beam exposure as described in FIGS. 1 and 2 supra. For the sake of brevity, only a general overview of the expose process 310 will be given. A blank binary reticle is introduced into an electron beam lithography (EBL) machine and placed upon a mechanical stage. The blank is substantially moved in conjunction with the location of the e-beam delivered to the surface of the reticle. The pattern generator operatively coupled to the EBL machine determines the movement of the reticle. Movement of the e-beam across the surface of the reticle can occur in a raster scheme, for example, which provides for allowing the beam to move substantially across the entire surface of the reticle. When the beam encounters an addressable location on the reticle, power is delivered to the e-beam to "write" desired features into the resist (e.g. chemically amplified resist). Exposure to the e-beam causes photochemical transformations to occur within the resist which can cause either a positive (e.g. material stays where written) or negative (e.g. material is removed where written) change in the chrome film below the resist layer after a development process.

For a reticle size of six by six inches, exposing the entire resist can take 5 to 10 hours. Time to complete the exposure can vary relative to the number and layout of desired critical dimensions on a reticle. Such time delay required to complete the exposure for a given reticle has implications relating to the CDs that are written onto the surface of the substrate. This follows from the highly reactive CAR employed to expose the reticle. Airborne contaminants and/or a vacuum effect can relate to changes in CDs after they have been written into a resist. Thus, measures can be taken to provide for filtration of air utilized in a fabrication exposure environment to limit the amount of contamination and prevent defects such as "T-topping" and the like. Further, consistent write times for a known reticle size can provide for a stable inspection process wherein the data relating to time delay defects can be tracked.

Figure 4:
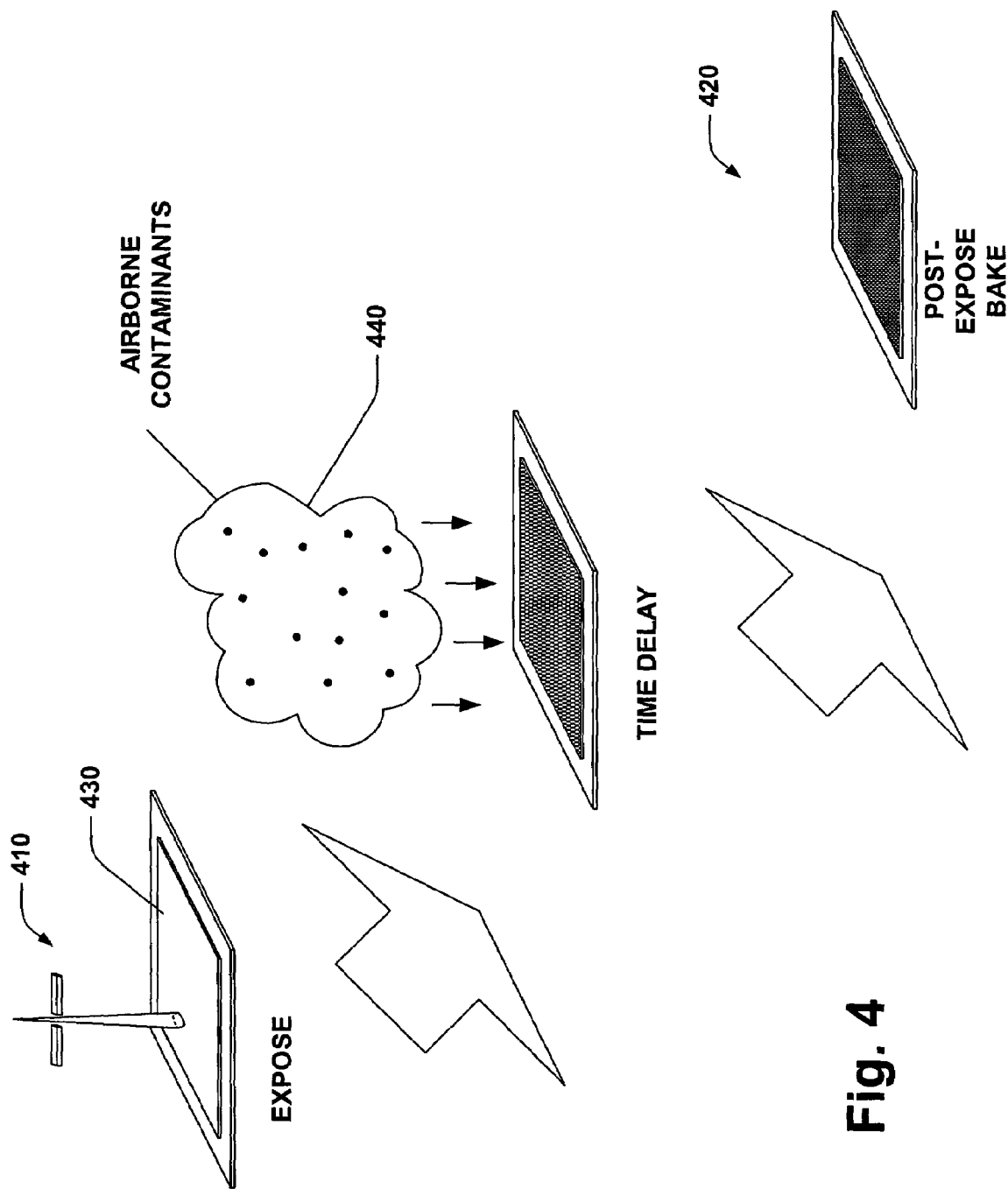
FIG. 4 illustrates contamination that can occur between the expose and post-expose bake steps in reticle fabrication.

Turning briefly to FIG. 4, which illustrates the time between expose 410 and post-expose bake (PEB) 420, where the risk of contamination is greatest. The reticle 430 in this particular example has a chemically amplified resist (CAR) on top of the chrome and quartz layers to comprise a binary mask as described supra. The CAR used in conjunction with an EBL system is sensitive to delay time and airborne contaminants (AC) 440 that can cause difficulty maintaining CD control related to the resist. The CAR employed in this fabrication process is extremely vulnerable to minute levels of amine contamination 440. In the example shown, amine contaminants such as ammonia, ammonium hydroxide, HMDS and NMP, the amine component (electron donor) reacts with a proton in the CAR, neutralizing it and preventing it from performing its catalytic function. CD degradation with prolonged exposure to amine contaminants 440 can result in anomalies such as CD shifts and/or a "T-top effect" where the resist smoothes at the top of a feature (e.g. isolated and/or dense lines). After PEB 420, the resist susceptibility to amine contamination 440 drops to negligible levels.

Once the expose process step is complete, the reticle, at 320, is placed into a post-expose bake (PEB) process. Chemically amplified resists (CARs) using acid catalysts have now become indispensable for the manufacture of semiconductor devices at sub-half-micron and lower levels. Positive-type chemically amplified resists use a photochemical reaction to generate acid, and in the heating process following the exposure (e.g. PEB) this acid acts as a catalyst to dissociate protection groups. Consequently, in addition to the efficiency of acid generation by exposure and acid diffusion, the types of protection groups, protection ratio and other factors are closely related to the resist performance.

Some resists do not require a post-expose bake process step before development causing this step to be utilized dependent on the type of CAR employed with the reticle. Therefore, in disparate embodiments of this methodology, a PEB step would be unnecessary and thus eliminated.

Development of chemically amplified resists (CAR) with increased efficiency of crosslinking or polarity change due to the catalytic reactions during PEB makes e-beam resists more attractive for sub-micrometer resolution lithography. However, the nature of the image formation in CARs implies certain mobility of the catalyst molecules produced by the exposure. A considerable diffusion rate of the photogenerated acid can degrade the latent image in the course of PEB. Therefore, for high-sensitivity CARs, parameters of the PEB process such as the uniformity of heating, the temperature, duration of the PEB, and the timing of the lithographic process as a whole are crucial for the pattern edge definition and the CD control. The diffusion rate of the catalyst in the resist is mainly defined by two parameters: (1) molecular weight of the catalyst molecules (e.g. their size) and (2) viscosity of the base polymer.

At 330, development of the resist is facilitated to turn the image exposed (e.g. written) onto the resist into the final resist. The developed resist profile depends not only on absorbed energy density, but also on the development process itself. An ability to predict resist profiles as a function of the exposure parameters therefore requires development models integrated with the exposure models. There is usually a change in the molecular weight for a given e-beam exposure level given by the following equation (for a positive resist), $$M_f = \frac{M_n^0}{1 + \frac{G(s)EM_n^0}{100\rho A_0}},$$

where $\rho$ is the resist density, $A_0$ is Avogadro's number ($6.02\times10^{23}$), $G(s)$ is the number of scissions per 100 eV of absorbed energy, $M_n^0$ is the original number average molecular weight, and $M_f$ is the final number average molecular weight.

Knowing the change in weight for a given exposure level and the dependence of solubility on fragmented molecular weight, the 2-D E(r, z) can be transformed into a solubility rate matrix, and the profile can be determined as a function of development time. For PMMA resists (a commonly utilized e-beam resist), for example, the effects can be expressed utilizing the following empirical equation, $$R = R_0 + \frac{\beta}{M_f^\alpha}$$

where $R_0$, $\beta$ and $\alpha$ are empirically determined constants that depend on the developer used.

At 340, according to one aspect of the present invention, an inspection process is accomplished utilizing scatterometry. Details of the inspection process are provided in FIG. 7, infra.

At 350, a data-mining algorithm is utilized to collect data from the inspection process 340 and to calculate parameter changes to the exposure, PEB and develop stages to facilitate fabrication within a desired tolerance. The data-mining algorithm 350 can employ various inference schemes and/or techniques in connection with measuring and controlling expose 310, PEB 320 and develop 330 parameters utilized with reticle fabrication. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic, meaning the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, evolutionary programming, memory based reasoning, decision trees, genetic algorithms, nonlinear regression methods, Bayesian belief networks . . . ) can be employed in connection with performing automatic and/or inferred action in connection with the subject invention.

In the present invention, data can be collected from a plurality of sources including the fabrication process steps as described supra. Information relating to the fabrication of a reticle may not be limited to just one fabrication step such as an inspection of CDs written in a reticle. For example, gathering data such as beam size, current density, PEB duration, PEB temperature, etc. can provide a context in which to interpret the dimensional data. Thus, data collected can be utilized to effect changes to more than one parameter within a fabrication process and/or a plurality of processes.

At 360 an advanced process control (APC) system is utilized in accordance with the analysis performed by the data-mining algorithm and can be one of two main categories: run-to-run (R2R) control and fault detection and classification (FDC). APC analyzes data and delivers an optimized set of machine variables for process tools utilized in the fabrication of the reticles, for example. R2R control of a process on a tool utilizes data from outgoing and incoming wafers, in combination with a model of a process in such tool, to adjust process parameters. Fault detection is the prediction of an imminent tool failure, and fault classification determines the cause of that failure.

Run-to-run control can use the data analyzed from the data-mining algorithm to adjust processes such as expose, PEB and develop on a run-to-run basis. In this example, a run can be a batch of reticle lots, a single lot or even a single reticle, depending on the particular needs of a process and a fabrication. R2R control provides for reticle fabrication parameters close to desired nominal values using both feed forward and feedback. Data taken immediately after a process step on a particular tool can be fed back to adjust the recipe for the following run. Conversely, utilizing a feed forward control scheme, data is sent to the next tool to adjust its recipe which can proactively prevent process values from falling outside a desired tolerance. Utilizing both feed forward and feedback control in conjunction with one another can provide for an improved process leading to an improved fabrication. Advanced equipment control fits into two main categories: real-time control (e.g. endpoint detection) and fault detection which can occur at many levels within a process tool. Typically, individual components in a tool have setpoints and signal alarms when they exceed a desired setpoint. However, utilizing model-based control allows the use of a predictive alarm, alerting personnel to temporarily halt fabrication until an error is corrected.

Figure 5:
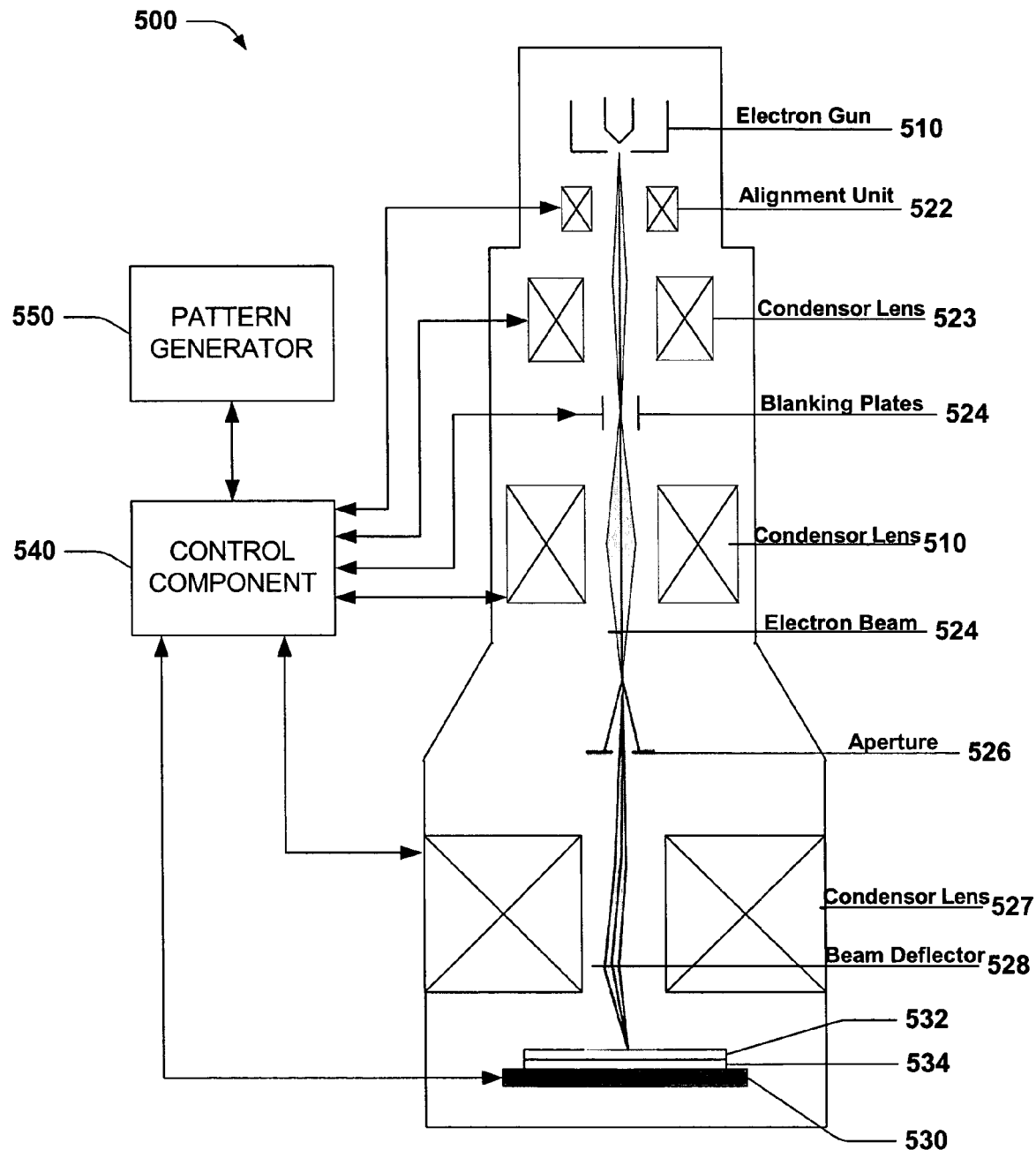
FIG. 5 illustrates the components of an electron beam lithography system employed in reticle fabrication.

FIG. 5 illustrates an electron beam lithography (EBL) system 500 utilized to fabricate a reticle for implementation in wafer design and manufacture, for example. Direct write EBL systems are the most common EBL systems. Typically, direct write EBL systems use a small electron beam spot moved with respect to the reticle to expose such reticle one pixel at a time. Direct write systems can be classified as raster scan or vector scan with either fixed or variable beam geometry.

In this particular embodiment, the EBL system 500 consists of four subsystems to facilitate the delivery of an electron beam (e-beam) onto the surface of a substrate (e.g. reticle covered with an electron resist). The four subsystems are an electron source 510, an electron column 520, a mechanical stage 530 and a control component 540.

The e-beam is capable of writing critical dimensions (CDs) that are sub-micron in size. In order to facilitate such features, the electron beam must first be generated and then focused into a small diameter onto the surface of a substrate. To accomplish short resist exposure times required to "write" on the substrate, the current density of the focused spot must also be high. The electron beam is produced by the electron source (or electron gun) 510. By way of illustration and not limitation, two types of electron guns commonly utilized in e-beam systems are thermionic sources and field emission sources.

Thermionic sources utilize a material which is heated to the elevated temperature to which electrons are emitted. Examples of materials employed with thermionic electron emitters include tungsten (W) and lanthanum hexaboride ($LaB_6$). Tungsten sources provide a stable current, exhibit good tolerance to vacuum conditions and last approximately 100 hours. Lanthanum hexaboride has a lower work function than the tungsten source and therefore can provide a brighter source that lasts for approximately 1000 hours. However, this source exhibits less stability and requires better vacuum conditions to operate. Nevertheless, $LaB_6$ sources can emit over an extended area (allowing them to be used in shaped beam systems), and because of these advantages have become the standard emitter source for thermionic electron guns in EBL systems.

Field emission sources produce a very high electric field at the sharp tip of an emitter to create a fine Gaussian (e.g. circular) spot on a substrate. These sources, although brighter than thermionic emitters, exhibit unstable emission behavior and require an ultra high vacuum for effective operation. Thus, they are not utilized as widely as the thermionic sources mentioned above.

The electron column 520 consists of the electron source 510, an alignment coil 522, a plurality of various lenses 523, 525, 527 used to focus and magnify or demagnify the electron beam, a beam blanker 524 to turn the beam on and off, an aperture 526 to limit and shape the beam and a beam deflection system 528 to position the beam on the substrate.

EBL systems utilized in research applications must provide the smallest possible spot to achieve a high resolution. In contrast, EBL systems dedicated to the fabrication of reticles with feature sizes of 0.1–4.0 µm can operate effectively with a relatively large beam diameter. Since most thermionic electron sources produce electrons from a cathode that is 10–100 µm in diameter, in order to achieve sub micron spots, electron-optical demagnifying lenses 523, 525, 527 are required to reduce the beam diameter 100–1000 times. The lenses are also designed to reduce aberration which is one of the parameters that limits the resolution of the system. The tradeoff for reducing aberration is the reduction of the area over which the beam is scanned.

In order to write over an entire reticle 534 (e.g. six inches on a side), a mechanical stage 530 is utilized to position the reticle 534 under the e-beam 520. In this embodiment, the reticle 534 has an e-beam resist 532 to facilitate writing CDs on the surface of the reticle 534. The position of the stage 530 must be accurately known at all times and can be controlled by a laser interferometer to a very high resolution (e.g. better than 16 nm). The velocity of the stage 530 is important in determining the throughput of the system because patterns can be written only after stage position has been determined. Also, it is possible to write the pattern "on the fly" which requires the stage 530 position to be known accurately so corrections can be made by the deflection system (not shown).

The control component 540 is utilized as an interface between the pattern generator 550 and the EBL system 500. The control component 540 also interfaces to substantially all of the devices (e.g. mirrors, blank and lenses.) to direct the location and delivery of the e-beam 520 to the surface of the substrate. Further, the control component 540 receives and transmits signals to the mechanical stage 530 to communicate location information relative to the substrate that is written upon. This aspect of the invention can be utilized in concert with the beam delivery to insure proper beam parameters (e.g. beam shape, current density, etc.) are correct for each location (e.g. pixel on the surface of the substrate).

The control component 540 further comprises a processor (not shown) and memory (not shown). It is to be understood that the processor can be a processor dedicated to determining the motion of the mechanical stage 530 required to write a specified pattern, the deflection required to write specific critical dimensions on a substrate or when to open/close the blanking mechanism 524 to substantially turn the e-beam 520 on or off.

The memory stores program code executed by the processor for carrying out operating functions of the system. The memory also serves as a storage medium for temporarily storing information, such as write speed, beam power, beam shape, pattern etc. that can be employed in carrying out the present invention. The memory can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

The writing strategy of an EBL system includes the shape of the e-beam 520 and the method scanning the beam over the reticle 534. The reticle to be exposed is subdivided into a grid of addressable locations. Each of these locations represents a pixel. A pixel defines the minimum resolution element that can be generated by the specified electron dose. The pixels are joined to create patterns shapes and the minimum observable pattern is one pixel exposed and one not exposed. For example, if the pixel size is 0.5 µm×0.5 µm, a 150 mm reticle would contain approximately $7.5 \times 10^{10}$ pixels. To form an acceptable image in a resist, a minimum number of electrons, $N_m$, must impinge upon each exposed pixel. For a given resist sensitivity, S (defined in units of C/cm$^2$), this minimum is given by:

$$N_m = \frac{SI_p^2}{q}$$

where $I_p$ is the minimum pixel dimension, and q is the electron charge.

Beside a fixed shaped beam, there are two alternative types of electron beams utilized with an e-beam system. They are a Gaussian shaped round beam and a variable shaped beam. The Gaussian round beam is typically four times smaller than the smallest pattern dimension. The spot of the variable shaped beam (VSB) is varied to match the feature size (e.g. larger pattern areas can be exposed by increasing the size of the beam). On the average, the shaped beam simultaneously exposes about 30 pixels.

Throughput can be higher with the VSB, but not as much as indicated by the ratio of the beam areas. This results from electron—electron interactions which impose a maximum limit on the current of a shaped beam. For beam currents greater than a few microamperes, the edge definition becomes limited by aberrations from such electron—electron aberrations, rather than by a combination of beam brightness and deflection aberrations. The full brightness of the electron gun, therefore, cannot be used for shaped beams, but can be for round beams.

After the beam is focused and shaped it requires scanning (e.g. deflection) over the reticle 534. Deflection is generally accomplished electromagnetically, although an electrostatic system also can be employed. Two types of scanning patterns are generally utilized: raster and vector scanning. The raster scan technique scans over the entire substrate and is turned on and off according to the desired pattern. The substrate 534 is broken down into a number of stripes or address units (AU), and deflected over that range. A laser-controlled table moves the substrate along the AU-stripe in the x-direction, while the beam is sweeping out one scan line in the y-direction.

The vector scan aligns the individual substrate, then exposes it with a two-dimensional electronic scan that covers the entire area. Since the scan area is smaller than a reticle 534 area, it is required to mechanically move the sample. This can be accomplished by step and repeat movement, or by continuous mechanical scanning, for example.

Figure 6:
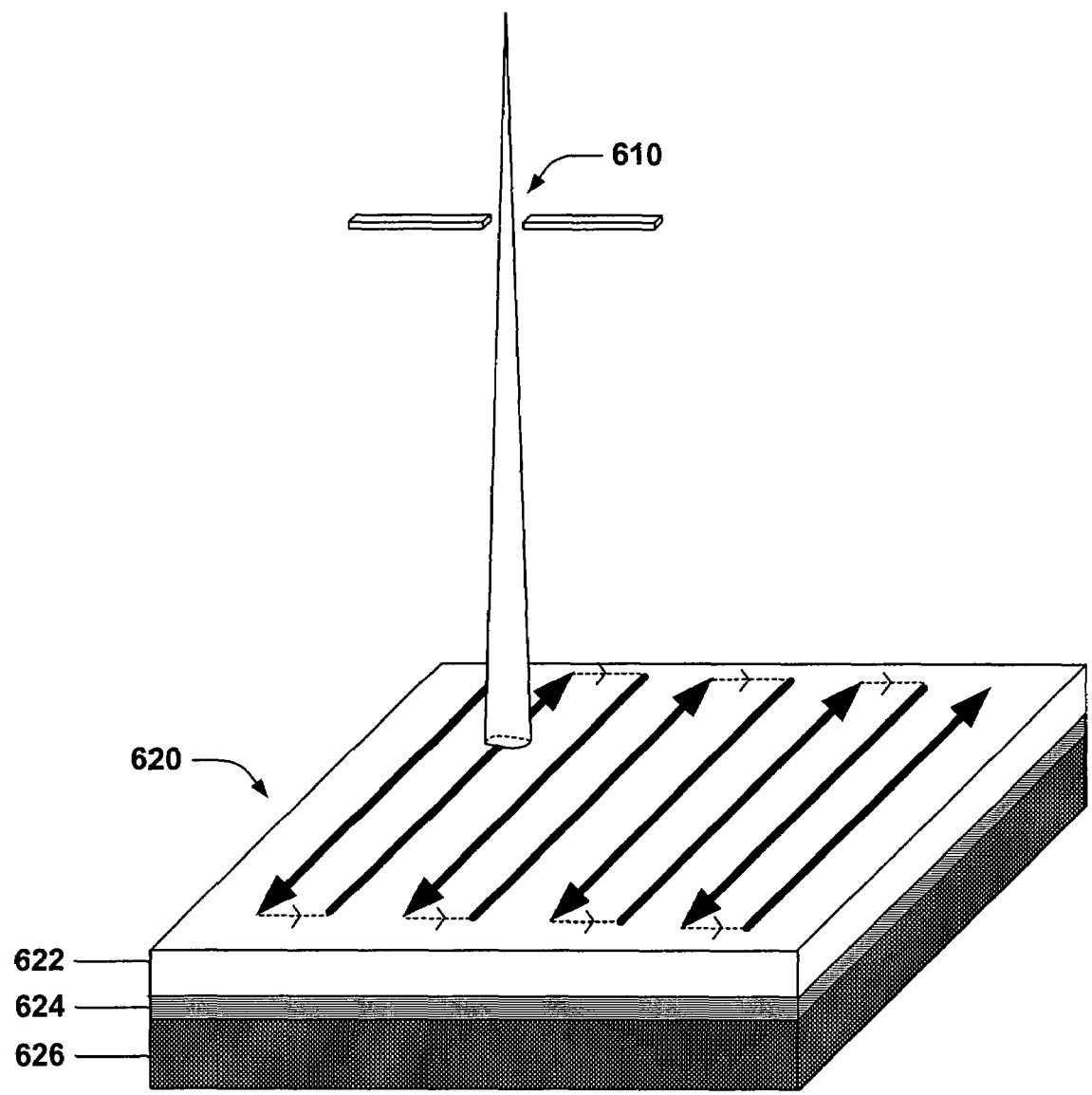
FIG. 6 illustrates an electron beam exposing a reticle utilizing a raster scheme.

FIG. 6 illustrates the movement of an e-beam system 610 as it writes a pattern on a substrate 620 (e.g. a reticle). In this particular embodiment, the motion of the e-beam 610 follows substantially a raster pattern as it moves across the surface of the substrate 620 scanning substantially the entire surface of the substrate 620 regardless of the location the e-beam 610 actually writes onto the surface. For example, if only two critical dimensions are to be written upon the substrate 610, the e-beam 620, following the raster pattern, would cover substantially the entire surface even though only two locations were required to produce the desired CDs on the surface of the reticle.

In this embodiment, the substrate consists of three disparate layers that comprise a binary blank mask upon which a pattern will be created. In this particular embodiment, a first layer 622 is an electron beam resist (e-beam resist) which can be used as a recording and transfer media for EBL systems. Typically, an e-beam resist is a chemically amplified resist (CAR) which contains polymers dissolved in a liquid solvent. A CAR reacts to exposure from an e-beam which provides for a change in the solubility of the resist. After baking out the casting solvent, electron exposure modifies the resist 622. There are two types of e-beam resists: positive tone and negative tone. A positive tone resist provides for exposed areas to become more soluble in a developer causing those areas to be removed by development. Some positive chemically amplified resists are: PMMA, EBR-9, PBS, ZEP 520-12, AZ5206, APEX-E, UV-5. A negative tone resist provides for the exposed area to become less soluble in the developer which remains behind after development. Some negative chemically amplified resists are: SAL-601, UVN2, UVN30, NEB-31, COP, SAL-606.

A second layer 624, is typically a metal substrate (e.g. chrome or another opaque photographic emulsion) that can be utilized to facilitate the writing of a binary mask, for example. The CAR changes properties of the chrome substrate as it is exposed to an electron beam.

A bottom layer 626 (e.g. quartz material) in this embodiment is synthetic quartz but can be any quartz type or glass such as fused silica, soda lime glass or calcium fluoride. Further the size and thickness of the glass may vary such as 5009, 5018, 6012, 6015, 6025 or 7012, for example.

As electrons penetrate into the resist some of them experience small angle forward scattering and many of them experience large angle scattering events leading to backscattering. This causes additional exposure in the resist 622 leading to an electron beam proximity effect. As the primary electrons slow down, much of their energy is dissipated in the form of secondary electrons with energies ranging from 2–50 eV. The primary electrons are responsible for the majority of the actual resist 622 exposure process. Since their range in resist is only a few nanometers, they contribute little to the proximity effect.

The fundamental parameter necessary to determine developed resist 622 profile is the absorbed energy density and its dependence on spatial position within the resist 622 film.

The Monte Carlo method attempts to simulate the trajectories of the incident electrons within the substrate. The procedure involves following an electron through a succession of distinct scattering events during which it undergoes angular deflection and energy loss. The angular distribution of scattered electrons is dependent on the assumed potential V(r), where r is the radius of the projected energy matrix (e.g. a three dimensional cone). Most calculations employ the Thomas-Fermi potential, which assumes that an incoming electron sees the atomic charge of the nucleus screened by the electron of the atom.

$$V(r) = \frac{Ze^2 \exp\left(\frac{-0.745 r Z^{\frac{1}{3}}}{a_0}\right)}{r}$$

Where $a_0$=Bohr radius (0.53 Å), and Z is the atomic number of the element.

From this atomic potential, the differential scattering cross-section per unit solid angle is given by the Rutherford expression, $$\frac{d\sigma}{d\Omega} = \frac{Z_i(Z_i+1)e^4}{4m^2v^2[\sin^2(\theta/2) + \alpha_i^2]^2}$$

Where m is the mass of electron, v is the electron's velocity, $Z_i$ is the atomic number of the $i^{th}$ species and $\alpha_i$ is the atomic screening parameter.

$$\alpha_i = 2.33 Z_i^{(1/3)} E^{-(1/2)}$$

Where E is the energy of the incident electron.

Between elastic scattering events, the electrons are assumed to travel in straight lines (of length equal to the mean free path) and undergo energy loss. The energy loss is modeled via the CSDA (continuous slowing down approximation) according to the Bethe energy loss formula, $$\frac{dE}{dx} = \frac{-2\pi e^2 n_e}{E} \ln\left(\frac{aE}{I}\right)$$

$n_e$ is the density of atomic electrons, I is the mean excitation energy and $\alpha$ is a constant equal to 1.166. Within the step length, the electron is assumed to have a constant electron energy $E_O$. Then energy stored at point '1' is then calculated by decrementing the energy with respect to its value at point '0' via the Bethe expression for energy loss per unit distance. This sequence is repeated continuously until the energy has degraded to some arbitrary value close to the mean ionization energy.

Figure 7:
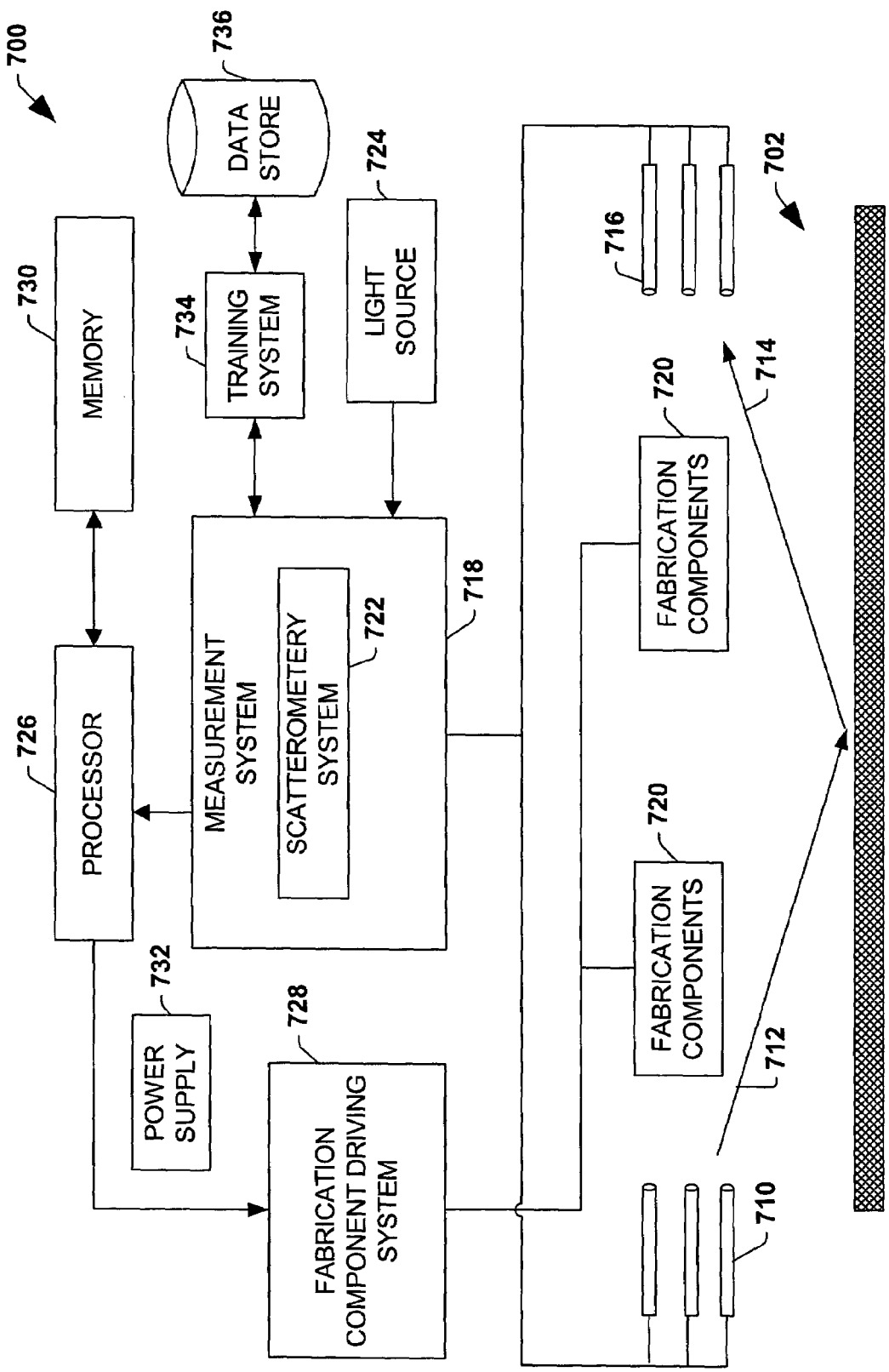
FIG. 7 illustrates a system for monitoring and controlling a semiconductor fabrication process according to one or more aspects of the present invention.

Turning to FIG. 7, a system 700 for monitoring and controlling a semiconductor fabrication process according to one or more aspects of the present invention is illustrated. A reticle 702, or a portion thereof, is depicted as undergoing the fabrication process.

One or more light sources 710 project light 712 onto respective portions of the structure 704, which cause the light to be reflected in different, quantifiable manners. Reflected light 714 is collected by one or more light detecting components 716, and processed by a measurement system 718 for a concurrent determination of critical dimensions. The reflected light 714 may, for example, be processed to generate signatures, which can be utilized to facilitate feedback and/or feed-forward control of one or more fabrication components 720 and/or operating parameters associated therewith as described herein to achieve desired critical dimensions.

The measurement system 718 includes a scatterometry system 722, which can be any scatterometry system suitable for carrying out aspects of the present invention as described herein. A source of light 724 (e.g., a laser) provides light to the one or more light sources 710 via the measurement system 718. Preferably, the light source 724 is a frequency stabilized laser, however, it will be appreciated that any laser or other light source (e.g., laser diode or helium neon (HeNe) gas laser) suitable for carrying out the present invention may be employed. Similarly, any one or more light detecting components 716 suitable for carrying out aspects of the present invention may be employed (e.g., photo detector, photo diodes) for collecting reflected light.

A processor 726 receives the measured data from the measurement system 718 and is programmed to control and operate the various components within the system 700 in order to carry out the various functions described herein. The processor, or CPU 726, may be any of a plurality of processors, and the manner in which the processor 726 can be programmed to carry out the functions described herein will be readily apparent to those having ordinary skill in the art based on the description provided herein.

The processor 726 is also coupled to a fabrication component driving system 728 that drives the fabrication components 720. The processor 726 controls the fabrication component driving system 728 to selectively control one or more of the fabrication components 720 and/or one or more operating parameters associated therewith as described herein. The processor 726 monitors the process via the signatures generated by the reflected and/or diffracted light, and selectively regulates the fabrication process by controlling the corresponding fabrication components 720. Such regulation enables controlling critical dimensions and overlay during fabrication and further facilitates initiating a subsequent fabrication phase with more precise initial data, which facilitates improved chip quality at higher packing densities.

A memory 730 is operable to store, among other things, program code executed by the processor 726 for carrying out one or more of the functions described herein. The memory may include, for example, read only memory (ROM) and random access memory (RAM). The RAM is the main memory into which the operating system and application programs are loaded. The memory 730 may also serve as a storage medium for temporarily storing information and data that may be useful in carrying out one or more aspects of the present invention. For mass data storage, the memory 730 may also include a hard disk drive (e.g., 50 Gigabyte hard drive).

A power supply 732 is included to provide operating power to one or more components of the system 700. Any suitable power supply 732 (e.g., battery, line power) can be employed to carry out the present invention.

A training system 734 may also be included. The training system 734 may be adapted to populate a data store 736 (which may be comprised within the memory 730) for use in subsequent monitoring. For example, the scatterometry system 722 can generate substantially unique scatterometry signatures that can be stored in the data store 736 via the training system 734. The data store 736 can be populated with an abundance of scatterometry signatures by examining a series of wafers and/or wafer dies. Scatterometry signatures can be compared to scatterometry measurements stored in the data store 736 to generate feed forward/backward control data that can be employed to control the fabrication process. It is to be appreciated that the data store 736 can store data in data structures including, but not limited to one or more lists, arrays, tables, databases, stacks, heaps, linked lists and data cubes. Furthermore, the data store 736 can reside on one physical device and/or may be distributed between two or more physical devices (e.g., disk drives, tape drives, memory units).

Turning now to FIGS. 8–10, in accordance with one or more aspects of the present invention, a reticle 802 situated on a stage 804 may be logically partitioned into grid blocks to facilitate concurrent measurements of critical dimensions and overlay as the reticle matriculates through a fabrication process. This may facilitate selectively determining to what extent, if any, fabrication adjustments are necessary. Obtaining such information may also assist in determining problem areas associated with fabrication processes.

Figure 12:
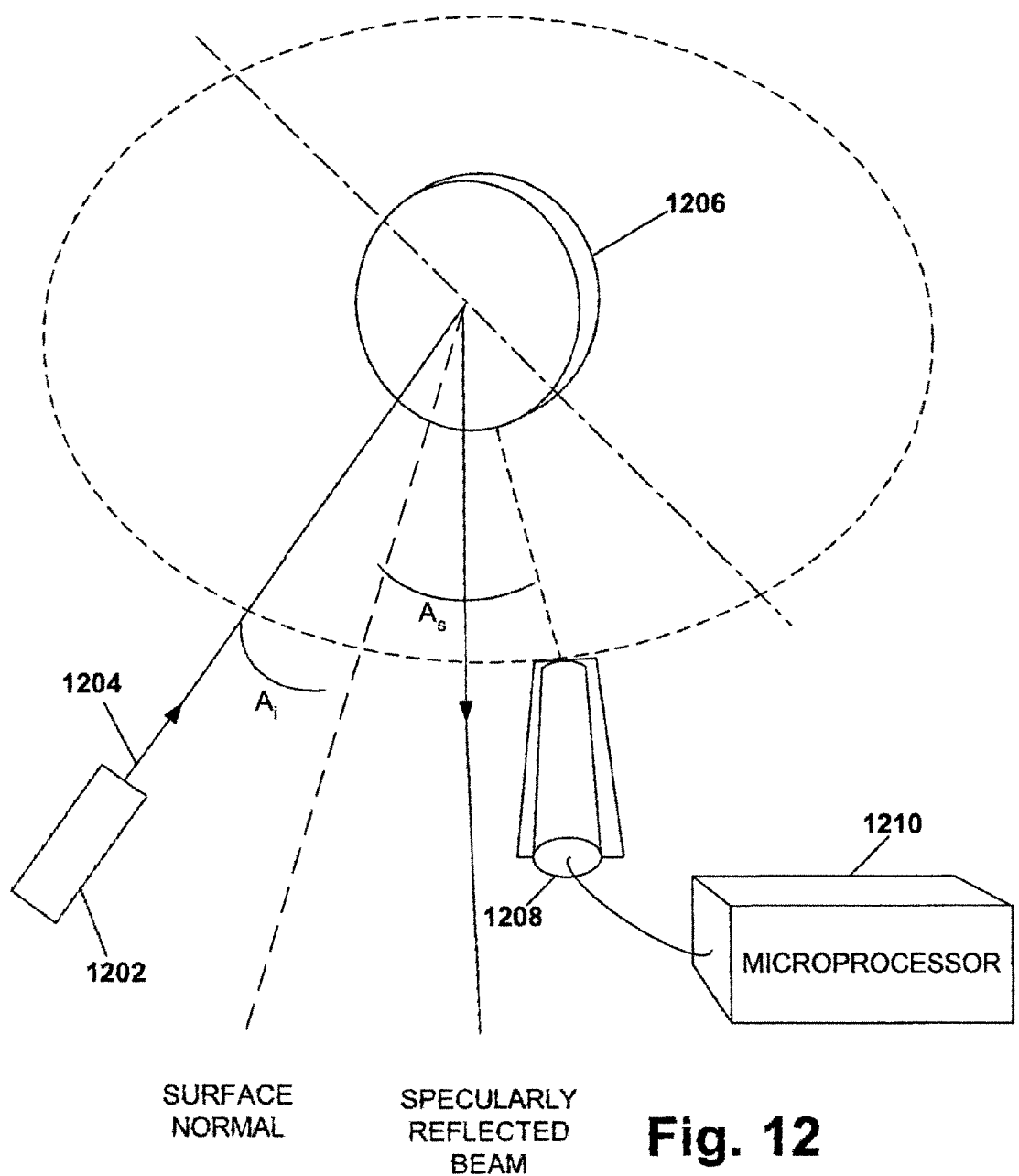
FIG. 12 illustrates an exemplary scatterometry system suitable for implementation with one or more aspects of the present invention.

FIG. 8 illustrates a perspective view of a steppable stage 804 supporting a reticle 802. The reticle 802 may be divided into a grid pattern as shown in FIG. 12. Each grid block (XY) of the grid pattern corresponds to a particular portion of the reticle 802 (e.g., a portion of a reticle). The grid blocks are individually monitored for fabrication progress by measuring critical dimensions such as isolated and dense lines and overlay with scatterometry techniques.

In FIG. 9, one or more respective portions of a reticle 802 ($X_1Y_1 \ldots X_{12}, Y_{12}$) are monitored for critical dimensions utilizing either scatterometry or scanning electron microscope techniques. Exemplary measurements produced during fabrication for each grid block are illustrated as respective plots. The plots can, for example, be composite valuations of signatures of critical dimensions of isolated and dense lines, for example. As can be seen, the measurement at coordinate $X_7Y_6$ yield a plot that is substantially higher than the measurement of the other portions XY. This can be indicative of one or more critical dimensions outside of acceptable tolerances. As such, fabrication components and/or operating parameters associated therewith can be adjusted accordingly to mitigate repetition of this aberrational measurement. It is to be appreciated that the reticle 802 may be mapped into any suitable number and/or arrangement of grid blocks to effect desired monitoring and control.

FIG. 10 is a representative table of measured critical dimensions taken at various portions of the reticle 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value (VA) (e.g., no overlay and critical dimensions are within acceptable tolerances), while grid block $X_7Y_6$ has an undesired value ($V_U$). Thus, it has been determined that an undesirable fabrication condition exists at the portion of the reticle 802 mapped by grid block $X_7Y_6$. Accordingly, fabrication process components and parameters may be adjusted as described herein to adapt the fabrication process accordingly to mitigate the re-occurrence or exaggeration of this unacceptable condition. Alternatively, a sufficient number of grid blocks may have desirable thickness measurements so that the single offensive grid block does not warrant scrapping the entire reticle. It is to be appreciated that fabrication process parameters may be adapted so as to maintain, increase, decrease and/or qualitatively change the fabrication of the respective portions of the reticle 802 as desired. For example, when the fabrication process has reached a pre-determined threshold level (e.g., X % of grid blocks have acceptable CDs and no overlay), a fabrication step may be terminated.

Figure 11:
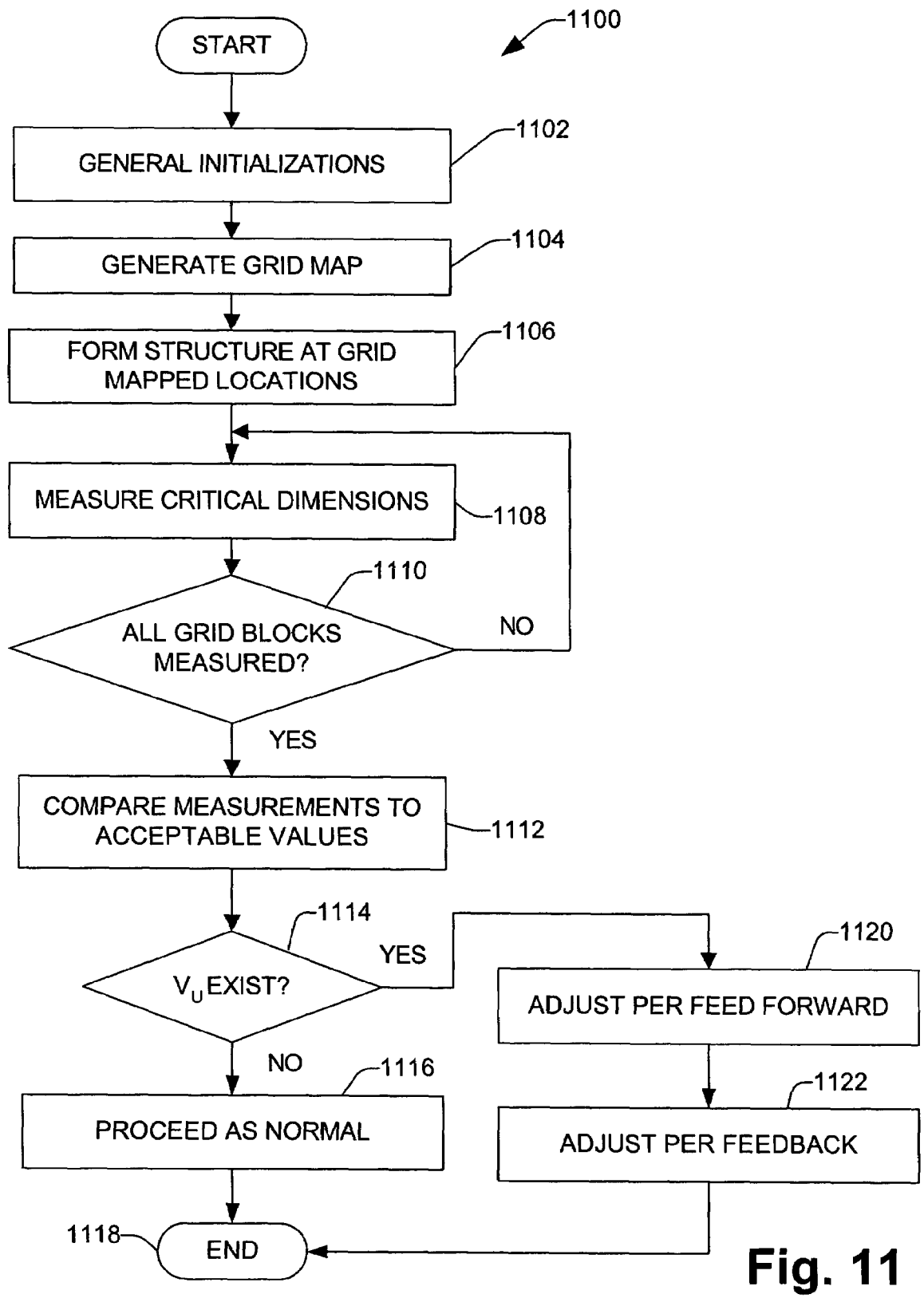
FIG. 11 is flow diagram illustrating a methodology for monitoring and controlling an IC fabrication process according to one or more aspects of the present invention.

FIG. 11 is flow diagram illustrating a methodology 1100 for monitoring and controlling a reticle fabrication process according to one or more aspects of the present invention. The methodology begins at 1102 wherein general initializations are performed. Such initializations can include, but are not limited to, establishing pointers, allocating memory, setting variables, establishing communication channels and/or instantiating one or more objects. At 1104, a grid map comprising one or more grid blocks "XY" is generated. Such grid blocks may correspond to locations on the reticle and or to portions of one or more locations on a reticle, for example. At 1106, a structure such as that described herein is formed at respective grid mapped locations on the reticle to facilitate concurrent measurement of critical dimensions and overlay with either scatterometry or scanning electron microscope (SEM) techniques at the grid mapped locations. At 1108, as the reticle matriculates through the fabrication process, overlay and critical dimensions, such as depth, width, height, slope, etc. are concurrently measured with either scatterometry or SEM at the grid mapped locations via the structure formed at the respective locations. At 1110, a determination is made as to whether measurements have been taken at all (or a sufficient number) of grid mapped locations. If the determination at 1110 is NO, then processing returns to 1108 so that additional measurements can be made. If the determination at 1100 is YES, then at 1112 the measurements are compared to acceptable values to determine if overlay is occurring and/or if critical dimensions are within acceptable tolerances. By way of example, measurements of critical dimensions and overlay can be analyzed to produce signatures. These signatures can then be compared to acceptable signature values for critical dimensions and overlay at the grid mapped locations. Additionally, respective critical dimension and overlay signatures can be aggregated for the respective grid mapped locations to produce a single value for comparison to an acceptable value for the grid mapped locations. At 1114, a determination is made as to whether an undesired value ($V_U$) has been encountered (e.g., indicating that overlay is occurring and/or that one or more critical dimensions are outside of acceptable tolerances). If the determination at 1114 is NO, then at 1116 processing continues as normal. The methodology can then advance to 1118 and end. If, however, the determination at 1114 is YES, meaning that an undesired value was encountered, then at 1120, one or more fabrications components and/or operating parameters associated therewith can be adjusted as described herein according to feed forward control data derived from the measurements to mitigate or remedy the situation. For example, an exposing source can be turned off and/or data generated by sophisticated modeling techniques can be fed forward to post exposure baking and/or development stages to control processing parameters such as bake time and/or temperature to bring critical dimensions back to within acceptable tolerances and/or to mitigate overlay. At 1122, control data derived from the measurements can also be feed back to adjust one or more fabrications components and/or operating parameters associated therewith to mitigate re-occurrence of the undesired event during subsequent processing. For instance, stepped alignment of the reticle can be adjusted to facilitate proper placement of a line on subsequently processed dies. Similarly, exposure time and/or intensity can be controlled so that a line having a proper depth is formed within a photoresist layer. The methodology then ends at 1118. As mentioned above, events can occur in orders different from that depicted in FIG. 11. For example, measurements taken, as at 1106, can be compared to acceptable values, as at 1112, prior to determining whether measurements have been taken at all grid mapped locations, as at 1110.

FIG. 12 illustrates an exemplary scatterometry system suitable for implementation with one or more aspects of the present invention. Light from a laser 1202 is brought to focus in any suitable manner to form a beam 1204. A sample, such as a reticle 1206, is placed in the path of the beam 1204 and a photo detector or photo multiplier 1208 of any suitable construction. Different detector methods and arrangements may be employed to determine the scattered and/or reflected power. A microprocessor 1210, of any suitable design, may be used to process detector readouts, including, but not limited to, intensity properties of the specularly reflected light, polarization properties of the specularly reflected light, and angular locations of different diffracted orders. Thus, light reflected from the sample 1206 may be accurately measured.

Concepts of scatterometry and how they are employed in accordance with one or more aspects of the present invention are discussed with respect to FIGS. 13–18. Scatterometry is a technique for extracting information about a surface upon which an incident light has been directed. Scatterometry is a metrology that relates the geometry of a sample to its scattering effects. Scatterometry is based optical diffraction responses. Scatterometry can be employed to acquire information concerning properties including, but not limited to, horizontal/vertical alignment/shifting/compression/stretching, dishing, erosion, profile and critical dimensions of a surface and/or features present on a surface. The information can be extracted by comparing the phase and/or intensity of a reference light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the planarity of the surface, features on the surface, voids in the surface, the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature or stored value) library of intensity/phase signatures, a determination can be made concerning the properties of the surface. Such substantially unique intensity/phase signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a reticle can generate a first intensity/phase signature. Observed signatures can be combined with simulated and modeled signatures to form a signal (signature) library. Simulation and modeling can be employed to produce signatures against which measured intensity/phase signatures can be matched. In one exemplary aspect of the present invention, simulation, modeling and observed signatures are stored in a signal (signature) data store. Thus, when intensity/phase signals are received from scatterometry detecting components, the intensity/phase signals can be pattern matched, for example, to the library of signals to determine whether the signals correspond to a stored signature.

Figure 13:
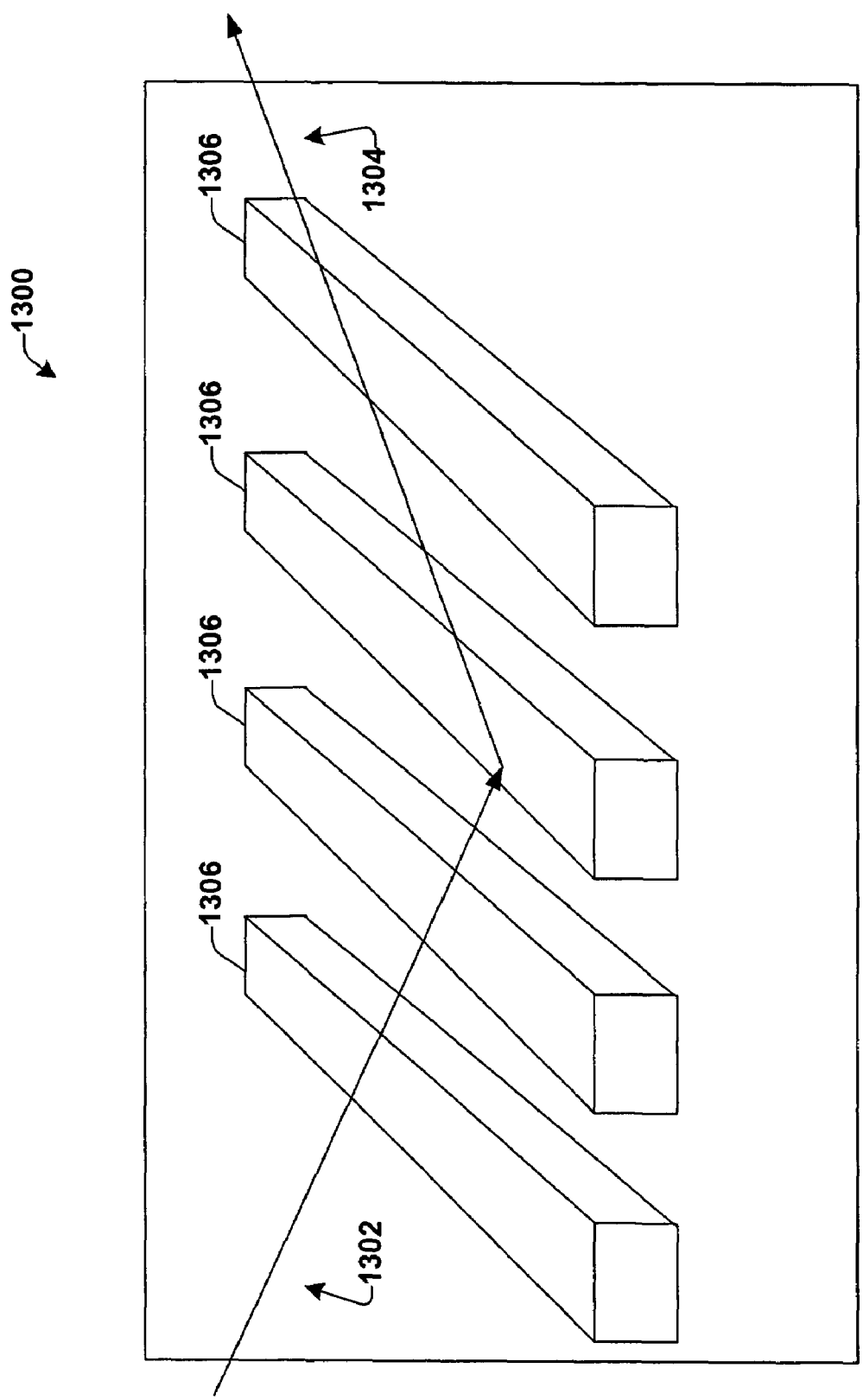
FIG. 13 is a simplified perspective view of an incident light reflecting off a surface in accordance with one or more aspects of the present invention.

To illustrate the principles described above, reference is now made to FIGS. 13 through 18. Referring initially to FIG. 13, an incident light 1302 is directed at a surface 1300, upon which one or more features 1306 may exist. The incident light 1302 is reflected as reflected light 1304. The properties of the surface 1300, including but not limited to, thickness, uniformity, planarity, chemical composition and the presence of features, can affect the reflected light 1304. The features 1306 are raised upon the surface 1300, but could also be recessed therein. The phase and/or intensity of the reflected light 1304 can be measured and plotted, as partially shown, for example, in FIG. 18. Such plots can be employed to compare measured signals with signatures stored in a signature library using techniques like pattern matching, for example.

Figure 14:
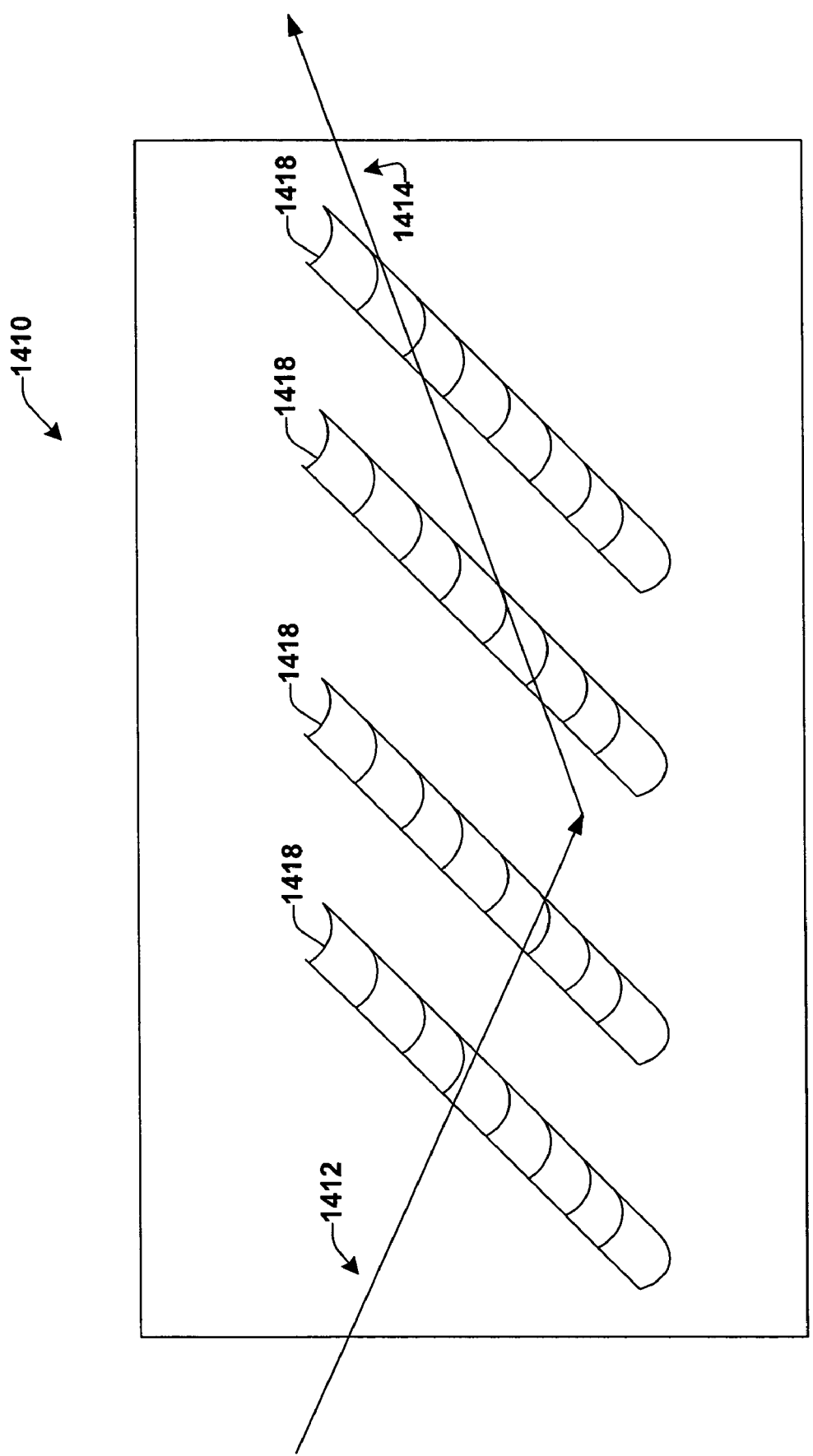
FIG. 14 is another simplified perspective view of an incident light reflecting off a surface in accordance with one or more aspects of the present invention.

Referring now to FIG. 14, an incident light 1412 is directed onto a surface 1410 upon which one or more depressions 1418 appear. The incident light 1412 is reflected as reflected light 1414. Depressions 1418 will affect the scatterometry signature to produce a substantially unique signature. It is to be appreciated that scatterometry can be employed to measure, among other things, features appearing on a surface, features appearing in a surface, features emerging in a pattern.

Figure 15:
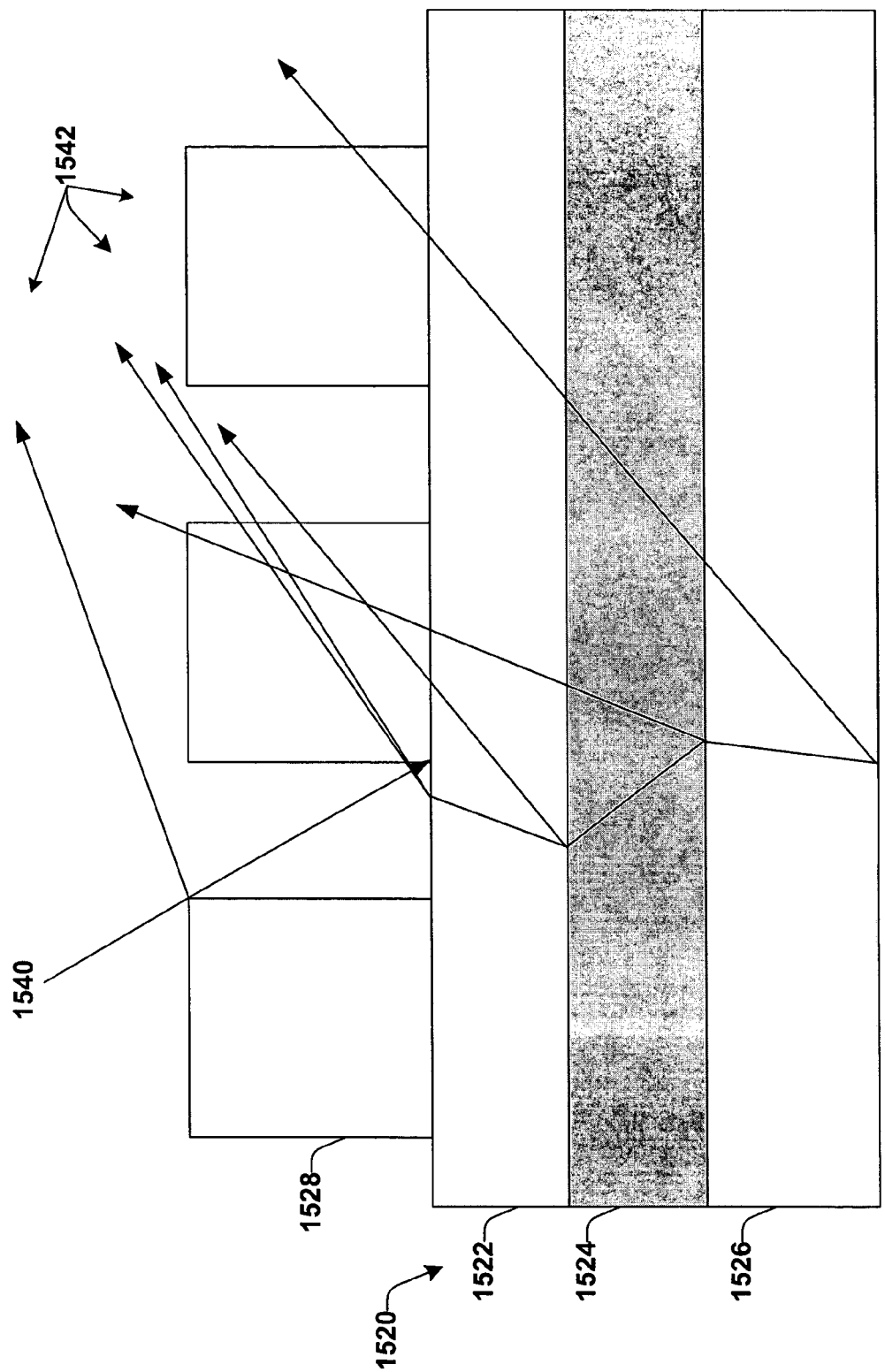
FIG. 15 illustrates a complex reflected and refracted light produced when an incident light is directed onto a surface in accordance with one or more aspects of the present invention.

Turning now to FIG. 15, complex reflections and refractions of an incident light 1540 are illustrated. The reflection and refraction of the incident light 1540 can be affected by factors including, but not limited to, the presence of one or more features 1528 and the composition of the substrate 1520 upon which the features 1528 reside. For example, properties of the substrate 1520 including, but not limited to the thickness of a layer 1522, the chemical properties of the layer 1522, the opacity and/or reflectivity of the layer 1522, the thickness of a layer 1524, the chemical properties of the layer 1524, the opacity and/or reflectivity of the layer 1524, the thickness of a layer 1526, the chemical properties of the layer 1526, and the opacity and/or reflectivity of the layer 1526 can affect the reflection and/or refraction of the incident light 1540. Thus, a complex reflected and/or refracted light 1542 may result from the incident light 1540 interacting with the features 1528, and/or the layers 1522, 1524 and 1526. Although three layers 1522, 1524 and 1526 are illustrated in FIG. 15, it is to be appreciated that a substrate can be formed of a greater or lesser number of such layers.

Figure 16:
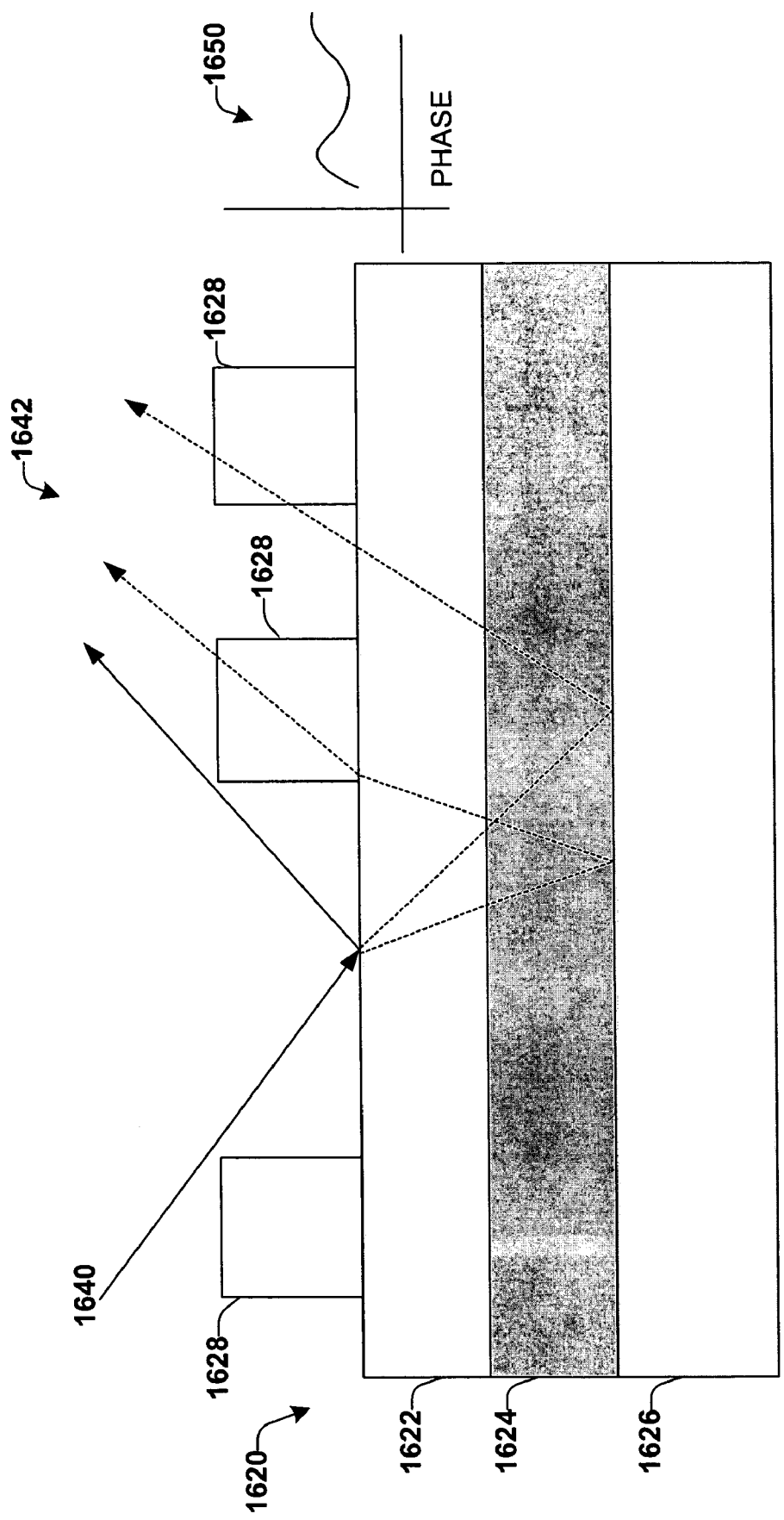
FIG. 16 illustrates another complex reflected and refracted light produced when an incident light is directed onto a surface in accordance with one or more aspects of the present invention.
Figure 17:
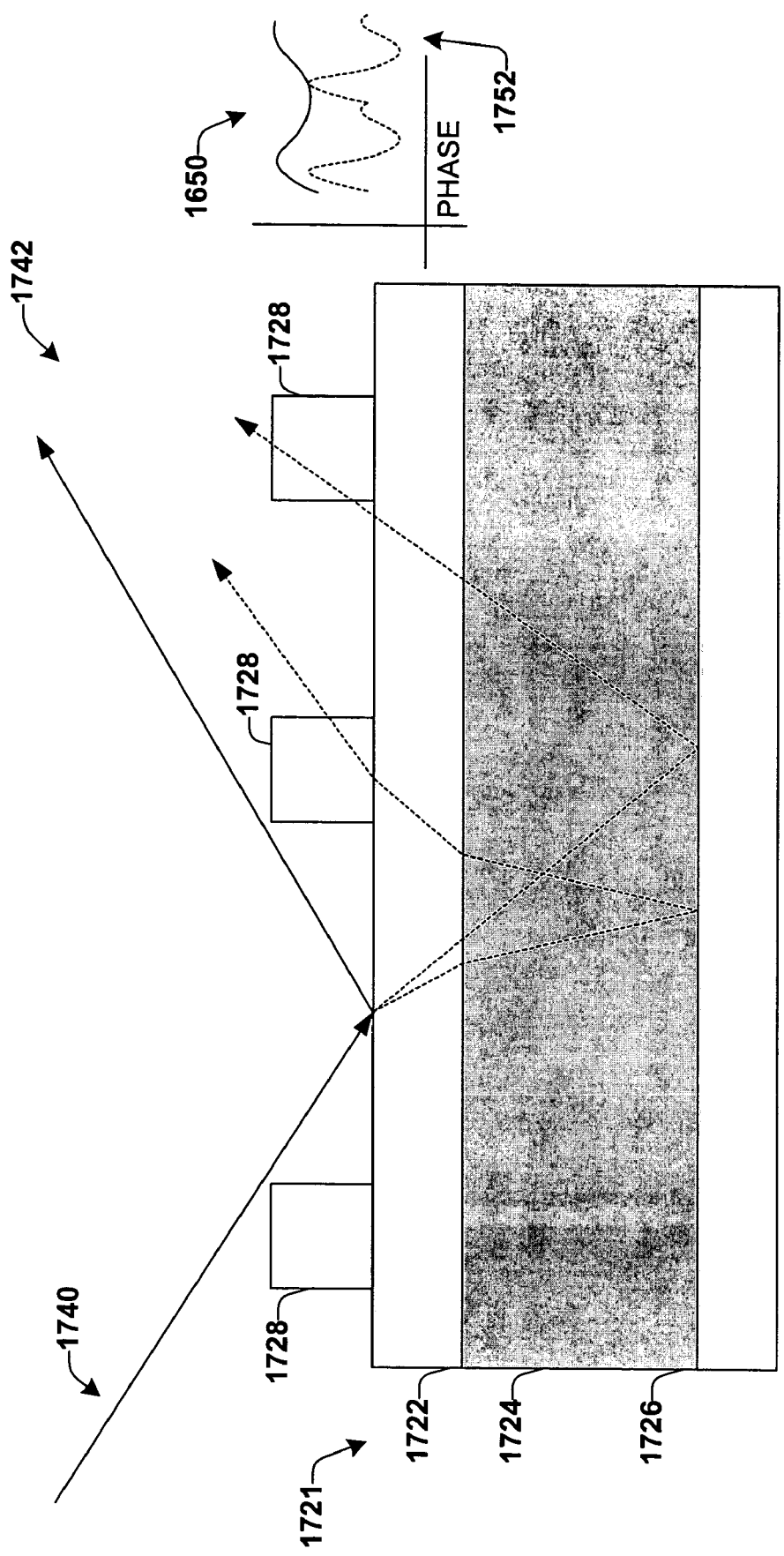
FIG. 17 illustrates yet another complex reflected and refracted light produced when an incident light is directed onto a surface in accordance with one or more aspects of the present invention.
Figure 18:
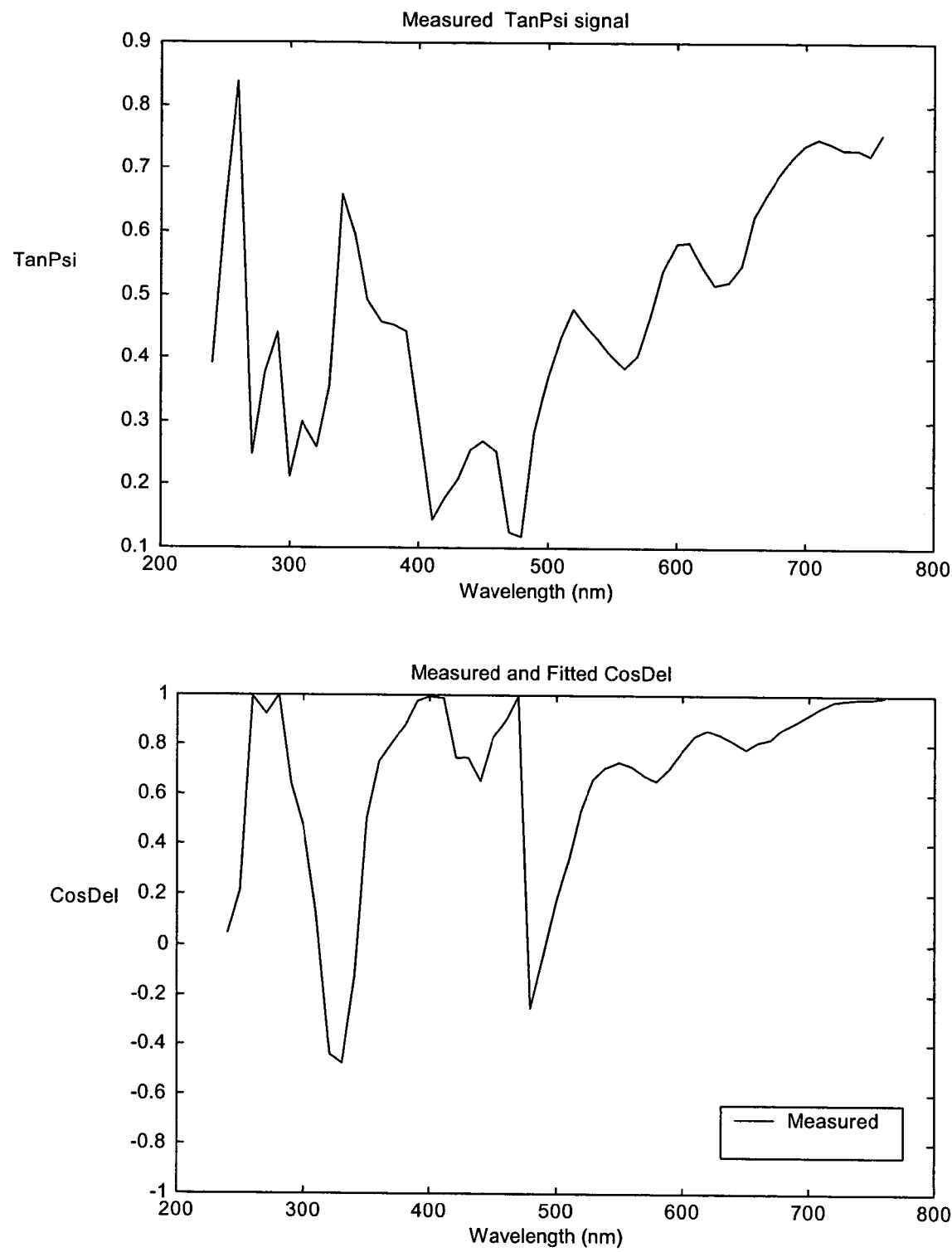
FIG. 18 illustrates phase and/or intensity signals recorded from a complex reflected and refracted light produced when an incident light is directed onto a surface in accordance with one or more aspects of the present invention.

Turning now to FIG. 16, one of the properties from FIG. 15 is illustrated in greater detail. The substrate 1620 can be formed of one or more layers 1622, 1624 and 1626. The phase 1650 of the reflected and/or refracted light 1642 from incident light 1640 can depend, at least in part, on the thickness of a layer, for example, the layer 1624. Thus, in FIG. 17, the phase 1752 of the reflected light 1742 differs from the phase 1650 due, at least in part, to the different thickness of the layer 1724 in FIG. 17.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

Using scatterometry in implementing one or more aspects of the present invention facilitates a relatively non-invasive approach to measuring opaque film thickness and to reproducing successful fabrication processes in subsequent development cycles.

Described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system that produces a reticle, comprising:
a reticle fabrication device; and
a regulation component that receives post-fabrication reticle scatterometry inspection data from the fabrication device and mitigates t-topping defects by utilizing the data to automatically adjust control parameters of the fabrication device, the control parameters comprise at least one of air filtration levels, electron beam exposure levels, electron beam size, bake duration and bake temperature.

2. The system of claim 1, further comprising a collection component that receives data sent from the fabrication device.

3. The system of claim 2, the collection component employing an algorithm to process received data.

4. The system of claim 3, the algorithm being a data-mining algorithm comprising at least one of: a neural network, evolutionary programming, memory based reasoning, a decision tree, a genetic algorithm a nonlinear regression and a Bayesian belief network.

5. The system of claim 1, the regulation component employing at least one of an advanced process control system, a statistical process control system, a feedback system, a feed forward system, a proportional-integral-derivative control system and a fuzzy logic control system.

6. The system of claim 1, the fabricating device further fabricating at least one of a semiconductor and a substrate.

7. The system of claim 1, the fabrication device employed to perform at least one of the steps of expose, post-expose bake, develop and inspection.

8. The system of claim 1, the reticle comprising at least one of a resist, an opaque metal film and a glass substrate.

9. The system of claim 8, the resist being at least one of a PMMA, an EBR-9, a PBS, a ZEP 520-12, an AZ5206, an APEX-E, an UV-5, a SAL-601, an UVN2, an UVN30, a NEB-31, a COP and a SAL-606 electron beam resist.

10. A system that fabricates a reticle, comprising:
an expose component that writes critical dimensions onto the surface of a resist employed in the fabrication of the reticle;
a develop component to process the resist;

an inspection component to insure the critical dimensions fabricated on the reticle are not outside of desired tolerances due to t-topping defects;

a data collection component that receives data from the expose component, the develop component and the inspection component;

a data processing component that determines what changes are needed to the system to improve reticle fabrication to fall within desired tolerances; and a feedback/feed forward control component to facilitate changes needed as determined by the data processing component, the feedback/feed forward control component is an advanced process control system that automatically reduces t-topping defects by changing one or more of air filtration levels, e-beam exposure levels, exposure time, exposure scheme, e-beam size and temperature.

11. The system of claim 10, further comprising a post-expose bake component.

12. The system of claim 10, the inspection component comprises at least one of a scatterometry system, an ellipsometry system, a laser displacement system, an inductive system and a capacitive system.

13. The system of claim 10, the advanced process control system further comprising at least one of run-to-run control and fault detection and classification control.

14. The system of claim 10, the data processing component is a data-mining algorithm.

* * * * *